(12) United States Patent
Shen et al.

(10) Patent No.: US 12,733,416 B2
(45) Date of Patent: Sep. 8, 2026

(54) SIN GAP FILL VIA NUCLEATION INHIBITION

(71) Applicant: Applied Materials, Inc., Santa Clara, CA (US)

(72) Inventors: Zeqing Shen, San Jose, CA (US); Supriya Ghosh, San Jose, CA (US); Susmit Singha Roy, Campbell, CA (US); Abhijit B. Mallick, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 391 days.

(21) Appl. No.: 18/495,094

(22) Filed: Oct. 26, 2023

(65) Prior Publication Data

US 2024/0145235 A1 May 2, 2024

Related U.S. Application Data

(60) Provisional application No. 63/381,461, filed on Oct. 28, 2022.

(51) Int. Cl.

| | |
|---|---|
| ***H10P 14/694*** | (2026.01) |
| ***H10P 14/60*** | (2026.01) |
| ***H10P 14/692*** | (2026.01) |

(52) U.S. Cl.

CPC .... *H10P 14/69433* (2026.01); *H10P 14/6316* (2026.01); *H10P 14/6318* (2026.01); *H10P 14/6319* (2026.01); *H10P 14/69215* (2026.01)

(58) Field of Classification Search

CPC ............. H10P 14/6309; H10P 14/6339; H10P 14/6522; H10P 14/61; H10P 14/6316; H10P 14/6318; H10P 14/6319; H10P 14/69215; H10P 14/69433

See application file for complete search history.

(56) References Cited

U.S. PATENT DOCUMENTS

| | | | | |
|---|---|---|---|---|
| 2014/0377963 | A1 | 12/2014 | Ellinger et al. | |
| 2016/0148800 | A1 | 5/2016 | Henri et al. | |
| 2017/0263437 | A1 * | 9/2017 | Li | H10P 14/69433 |
| 2018/0061628 | A1 * | 3/2018 | Ou | H10P 14/6339 |

(Continued)

OTHER PUBLICATIONS

PCT Notification of Transmittal of the International Search Report and the Written Opinion of the International Searching Authority for International Application No. PCT/US2023/036009; dated Feb. 21, 2024.

*Primary Examiner* — Edward Chin

(74) *Attorney, Agent, or Firm* — Patterson + Sheridan, LLP

(57) ABSTRACT

The present disclosure generally relates to methods for forming silicon nitride layers and silicon nitride structures on substrates. In an embodiment, the method includes positioning a substrate having at least one feature thereon in a process chamber; depositing a first silicon layer on the substrate and the at least one feature; nitriding the first silicon layer to form a first silicon nitride layer on the substrate and the at least one feature; selectively inhibiting silicon nucleation on a portion of the first silicon nitride layer to form an inhibited profile; selectively depositing a second silicon layer on the first silicon nitride layer in accordance with the inhibited profile; and nitriding the second silicon layer to form a second silicon nitride layer disposed directly on the first silicon nitride layer.

20 Claims, 7 Drawing Sheets

(56) References Cited

U.S. PATENT DOCUMENTS

| | | | | |
|---|---|---|---|---|
| 2018/0233349 | A1* | 8/2018 | Smith ................. | H10P 14/6339 |
| 2019/0115207 | A1* | 4/2019 | Smith ................. | H10P 14/6339 |
| 2021/0210339 | A1 | 7/2021 | Manna et al. | |
| 2022/0108915 | A1* | 4/2022 | Liu ................... | H01J 37/32146 |

* cited by examiner

SIN GAP FILL VIA NUCLEATION INHIBITION

RELATED APPLICATIONS

This application claims benefit of and priority to U.S. Application No. 63/381,461, filed Oct. 28, 2022, the entire contents of which are incorporated herein by reference.

BACKGROUND

Field

Embodiments of the present disclosure generally relate to manufacture of semiconductor components and devices. More specifically, embodiments described herein provide methods for forming silicon nitride layers on a semiconductor surface.

Description of the Related Art

In semiconductor processing, devices are being manufactured with continually decreasing feature dimensions. Often, features utilized to manufacture devices at these advanced technology nodes include high aspect ratio structures and it is often necessary to fill trenches between the high aspect ratio structures with a gap fill material. Examples where gap fill material layers are utilized include shallow trench isolation (STI), horizontal interconnects, vias between adjacent metal layers, inter-metal dielectric layers (ILD), pre-metal dielectrics (PMD), passivation layers, patterning applications, etc. As device geometries shrink and thermal budgets are reduced, void-free and seam-free filling of high aspect ratio spaces becomes increasingly difficult due to limitations of existing deposition processes.

Filling gaps between such high aspect ratio structures in a reliable manner, while avoiding voids or seams in the fill material is particularly challenging at this scale. Current processes for depositing gap fill material include Physical Vapor Deposition (PVD), Chemical Vapor Deposition (CVD), Atomic Layered Deposition (ALD), Plasma Enhanced Chemical Vapor Deposition (PECVD), and High Density Plasma Chemical Vapor Deposition (HDP CVD), each of which presents some issues for filling small dimension, high aspect ratio features. Depositing gap fill materials into small and, especially, high aspect ratio, features may cause formation of seams and voids inside the filled features. Large seams may lead to high resistance, contamination, loss of filled materials, and otherwise degrade performance of integrated circuits. For example, a seam may extend close to the field region after filling process and then open during chemical-mechanical planarization.

Thus, a need exists for improvement in methods for forming gap fill material layers in trenches between high aspect ratio structures.

SUMMARY

The present disclosure generally relates to methods for forming silicon nitride layers and silicon nitride structures on substrates. In an embodiment a method is provided for forming a silicon nitride structure on a substrate. The method includes positioning a substrate having at least one feature thereon in a process chamber; depositing a first silicon layer on the substrate and the at least one feature; nitriding the first silicon layer to form a first silicon nitride layer on the substrate and the at least one feature; selectively inhibiting silicon nucleation on a portion of the first silicon nitride layer to form an inhibited profile; selectively depositing a second silicon layer on the first silicon nitride layer in accordance with the inhibited profile; and nitriding the second silicon layer to form a second silicon nitride layer disposed directly on the first silicon nitride layer.

In one embodiment, a method for forming a silicon nitride gap fill is provided. The method includes positioning a substrate having at least one feature thereon in a process chamber, the at least one feature extending a depth from a substrate surface to a bottom surface, and having a width defined by a first sidewall and a second sidewall; depositing a first amorphous silicon layer on the substrate and the at least one feature; nitriding the first amorphous silicon layer to form a first silicon nitride layer on the substrate and the at least one feature; selectively oxidizing one or more portions of the first silicon nitride layer disposed on the substrate surface and on a top portion of the first and second sidewalls near an opening of the at least one feature in the substrate surface to form a silicon oxide layer on one or more portions of the substrate and inhibit silicon nucleation on the oxidized portions of the first silicon nitride layer; selectively depositing a second silicon layer on the remaining non-oxidized portions of first silicon nitride layer on the substrate; and nitriding the second silicon layer to form a second silicon nitride layer disposed directly on the remaining non-oxidized portions of the first silicon nitride layer.

In another embodiment, a method for forming a silicon nitride gap fill is provided. The method includes positioning a substrate having at least one feature thereon in a process chamber, the at least one feature extending a depth from a substrate surface to a bottom surface, and having a width defined by a first sidewall and a second sidewall; performing a deposition process to deposit a first amorphous silicon layer on the substrate and the at least one feature; performing a plasma nitridation process on the substrate to convert the first amorphous silicon layer to a first silicon nitride layer; performing a plasma oxidation process to selectively oxidize one or more portions of the first silicon nitride layer on one or more portions of the substrate and at least one feature; performing a deposition process to selectively deposit a second amorphous silicon layer on the remaining non-oxidized portions of first silicon nitride layer on the substrate; performing the plasma nitridation process on the substrate to convert the second amorphous silicon layer into a second silicon nitride layer disposed directly on the remaining non-oxidized portions of the first silicon nitride layer; and repeating the selective plasma oxidation, selective deposition, and plasma nitridation processes sequentially to fill the at least one feature with silicon nitride and form a silicon nitride gap fill.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
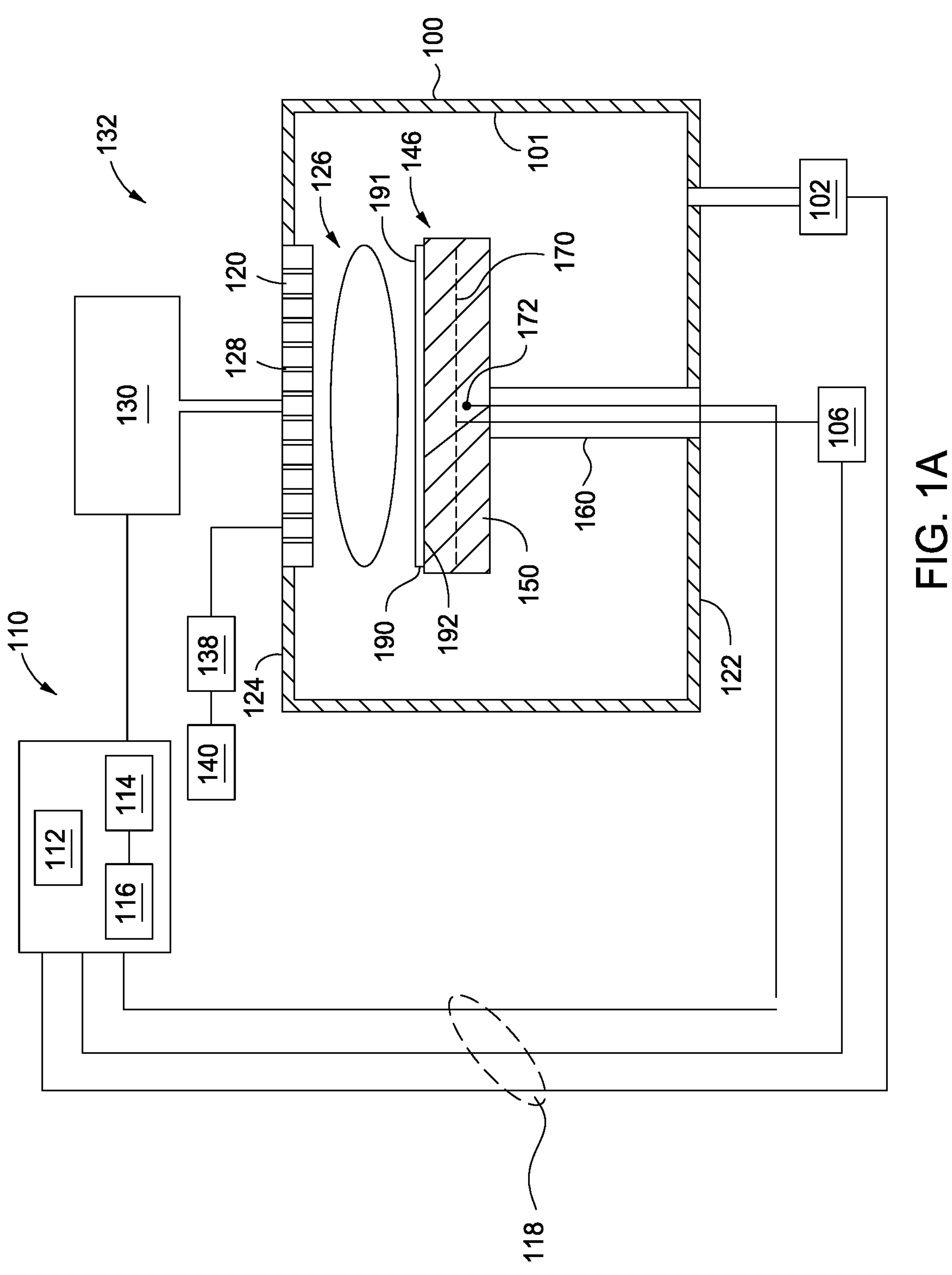
FIG. 1A shows a schematic illustration of an example process chamber that can be used for the practice of the method depicted in FIG. 2, according to certain embodiments of the present disclosure.

Embodiments of the present disclosure generally relate to apparatus and methods for the deposition of thin films to form interconnection structures on a substrate. Certain details are set forth in the following description and in FIGS. 1-5 to provide a thorough understanding of various implementations of the disclosure. Other details describing well-known methods and systems often associated with the deposition of thin films are not set forth in the following disclosure to avoid unnecessarily obscuring the description of the various implementations.

Many of the details, components and other features described herein are merely illustrative of particular implementations. Accordingly, other implementations can have other details, components, and features without departing from the spirit or scope of the present disclosure. In addition, further implementations of the disclosure can be practiced without several of the details described below.

Development of thin film materials which can fill high aspect ratio features (trenches between high aspect ratio structures) completely and efficiently remains an elusive goal. Thin films deposited by plasma CVD typically demonstrate poor conformality which can lead to void formation inside the high aspect ratio feature. Thin films deposited by thermal CVD typically demonstrate conformality higher than 90%. However, current methods of filling high aspect ratio features using thermal CVD typically result in seam formation.

Implementations of the present disclosure improve the gap-fill capability of thin silicon nitride films formed in high aspect ratio features, in comparison to thin silicon nitride films deposited using currently known thermal CVD techniques. Implementations described herein involve inhibition of silicon nucleation. In certain embodiments, the methods involve selective inhibition of deposited silicon along a portion of the high aspect ratio feature and adjacent structures (inhibited profile), followed by selective deposition in accordance with the inhibited profile. Methods of selectively inhibiting silicon nucleation can include exposing silicon deposited on the feature to a direct or remote plasma. In certain embodiment, the methods described herein can be used to bottom-up fill vertical features (such as in vias).

Selective inhibition, which may also be referred to as preferential inhibition, preferential passivation, selective passivation, differential inhibition, or differential passivation, involves inhibiting subsequent silicon nucleation on a portion of the feature or structure, while not inhibiting nucleation (or inhibiting nucleation to a lesser extent) on the remainder of the feature or structure. Once the features and structures are selectively inhibited, selective deposition according to the inhibited profile is selective in that silicon preferentially deposits on the lesser- and non-inhibited portions of the feature and structure. By utilizing selective silicon inhibition and deposition, the methods disclosed herein enable bottom-up formation of silicon nitride gap fill that is seam free. In certain embodiments, the methods described herein only use relatively low-cost precursor gases such as silane and disilane, as opposed to high-cost customized precursor gases in other processes. Accordingly, the disclosure described herein provides several benefits over conventional methods and techniques.

FIG. 1A is a schematic side cross sectional view of an example processing system 132 suitable for conducting a deposition process according to at least one embodiment disclosed here. Suitable chambers may be obtained from Applied Materials, Inc. located in Santa Clara, Calif. It is to be understood that the system described below is an exemplary process chamber and other chambers, including chambers from other manufacturers, may be used with or modified to accomplish embodiments of the present disclosure (e.g., method 200 described below). In some embodiments, the processing system 132 may be configured to deposit thin films onto a substrate using a chemical vapor deposition (plasma enhanced and/or thermal) process.

The processing system 132 includes a process chamber 100 coupled to a gas panel 130 and a controller 110. The process chamber 100 generally includes a top wall 124, a sidewall 101 and a bottom wall 122 that define a processing volume 126. A substrate support assembly 146 is provided in the processing volume 126 of the process chamber 100. The substrate support assembly 146 generally includes an electrostatic chuck 150 supported by a stem 160. The electrostatic chuck 150 may be typically fabricated from aluminum, ceramic, and other suitable materials. The electrostatic chuck 150 may be moved in a vertical direction inside the process chamber 100 using a displacement mechanism (not shown).

A vacuum pump 102 is coupled to a port formed in the bottom of the process chamber 100. The vacuum pump 102 is used to maintain a desired gas pressure in the process chamber 100. The vacuum pump 102 also evacuates post-processing gases and by-products of the process from the process chamber 100.

The substrate processing system 132 may further include additional equipment for controlling the chamber pressure, for example, valves (e.g., throttle valves and isolation valves) positioned between the process chamber 100 and the vacuum pump 102 to control the chamber pressure.

A gas distribution assembly 120 having a plurality of apertures 128 is disposed on the top of the process chamber 100 above the electrostatic chuck 150. The apertures 128 of the gas distribution assembly 120 are utilized to introduce process gases into the process chamber 100. The apertures 128 may have different sizes, number, distributions, shape, design, and diameters to facilitate the flow of the various process gases for different process requirements. The gas distribution assembly 120 is connected to the gas panel 130 that allows various gases to supply to the processing volume 126 during processing. A plasma is formed from the process gas mixture exiting the gas distribution assembly 120 to enhance thermal decomposition of the process gases resulting in the deposition of material on a surface 191 of the substrate 190.

The gas distribution assembly 120 and the electrostatic chuck 150 may form a pair of spaced apart electrodes in the processing volume 126. One or more RF power source 140 provide a bias potential through a matching network 138, which is optional, to the gas distribution assembly 120 to facilitate generation of plasma between the gas distribution assembly 120 and the electrostatic chuck 150. Alternatively, the RF power source 140 and the matching network 138 may be coupled to the gas distribution assembly 120, the electrostatic chuck 150, or coupled to both the gas distribution assembly 120 and the electrostatic chuck 150, or coupled to an antenna (not shown) disposed exterior to the process chamber 100. In some implementations, the RF power source 140 may produce power at a frequency of 350 KHz, 2 MHz, 13.56 MHz, 27 MHz, 40 MHz, 60 MHz, or 100 MHz. In one implementation, the RF power source 140 may provide between about 100 Watts and about 3,000 Watts at a frequency of about 50 kHz to about 13.6 MHz. In another implementation, the RF power source 140 may provide between about 500 Watts and about 1,800 Watts at a frequency of about 50 kHz to about 13.6 MHz.

The controller 110 includes a central processing unit (CPU) 112, a memory 116, and a support circuit 114 utilized to control the process sequence and regulate the gas flows from the gas panel 130. The CPU 112 may be of any form of a general-purpose computer processor that may be used in an industrial setting. The software routines can be stored in the memory 116, such as random access memory, read only memory, floppy, or hard disk drive, or other form of digital storage. The support circuit 114 is conventionally coupled to the CPU 112 and may include cache, clock circuits, input/output systems, power supplies, and the like. Bi-directional communications between the controller 110 and the various components of the substrate processing system 132 are handled through numerous signal cables collectively referred to as signal buses 118, some of which are illustrated in FIG. 1A.

Figure 1B:
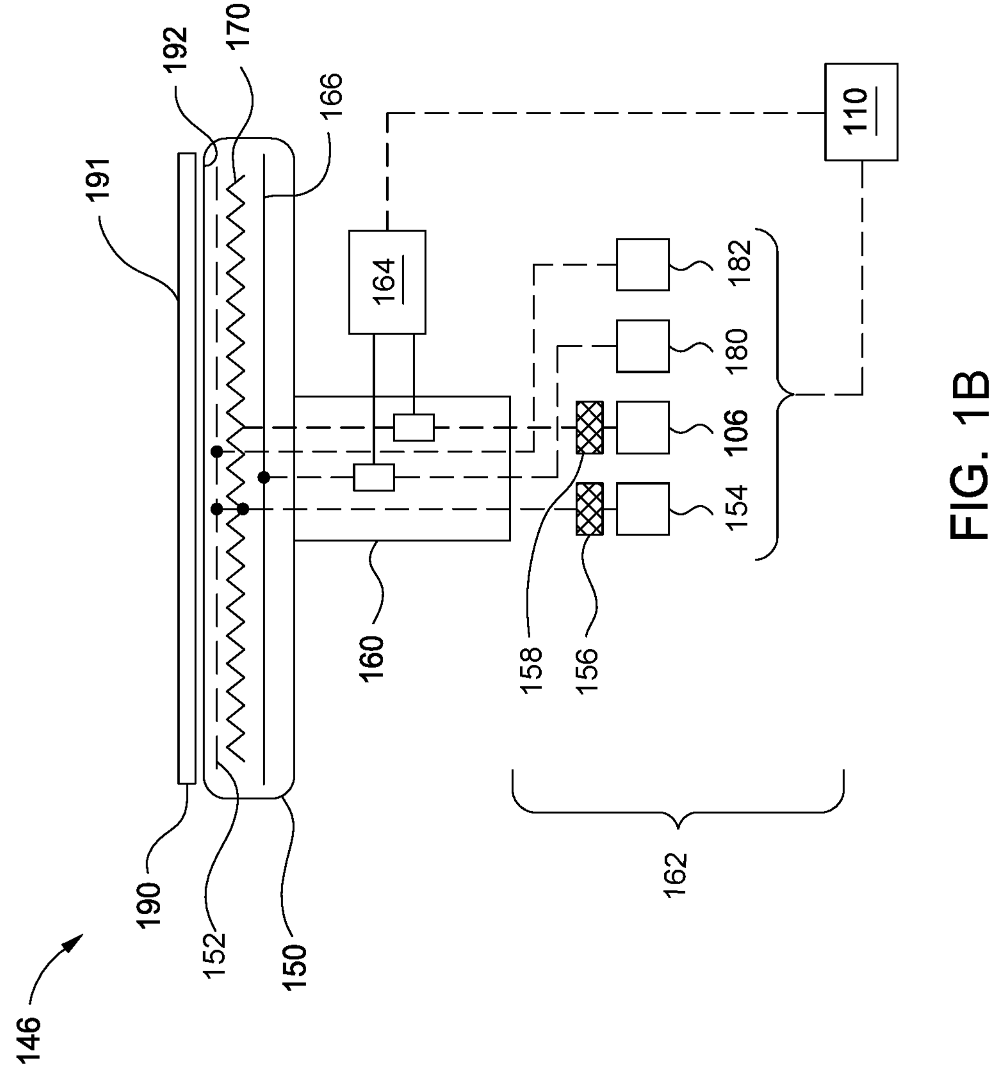
FIG. 1B shows a schematic cross-sectional view of an electrostatic chuck that may be used in the apparatus of FIG. 1A, according to certain embodiments of the present disclosure.
Figure 2:
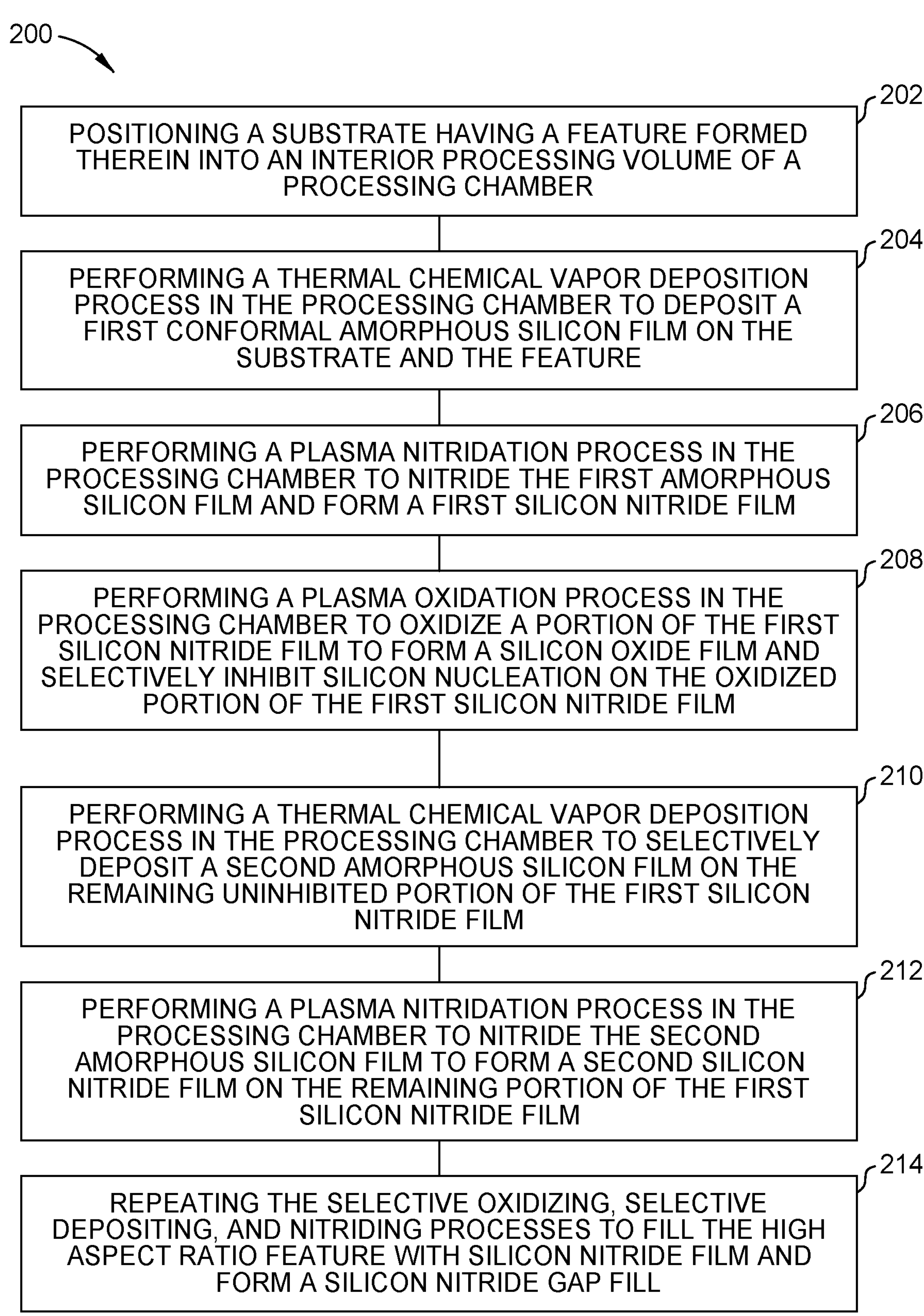
FIG. 2 depicts a flow diagram of an embodiment of a method for forming a silicon nitride gap fill in a feature formed on a substrate using the process chamber depicted in FIG. 1A, according to certain embodiments of the present disclosure.

FIG. 1B depicts a schematic cross-sectional view of the substrate support assembly 146 used in the processing system of FIG. 1A. Referring to FIG. 2, the electrostatic chuck 150 may include a heater element 170 suitable for controlling the temperature of a substrate 190 supported on an upper surface 192 of the electrostatic chuck 150. The heater element 170 may be embedded in the electrostatic chuck 150. The electrostatic chuck 150 may be resistively heated by applying an electric current from a heater power source 106 to the heater element 170. The heater power source 106 may be coupled through an RF filter 158. The RF filter 158 may be used to protect the heater power source 106 from RF energy. The heater element 170 may be made of a nickel-chromium wire encapsulated in a nickel-iron-chromium alloy (e.g., INCOLOY®) sheath tube. The electric current supplied from the heater power source 106 is regulated by the controller 110 to control the heat generated by the heater element 170, thus maintaining the substrate 190 and the electrostatic chuck 150 at a substantially constant temperature during film deposition. The supplied electric current may be adjusted to selectively control the temperature of the electrostatic chuck 150 between about −50 degrees Celsius to about 600 degrees Celsius.

Referring to FIG. 1A, a temperature sensor 172, such as a thermocouple, may be embedded in the electrostatic chuck 150 to monitor the temperature of the electrostatic chuck 150 in a conventional manner. The measured temperature is used by the controller 110 to control the power supplied to the heater element 170 to maintain the substrate at a desired temperature.

The electrostatic chuck 150 includes a chucking electrode 152, which may be a mesh of a conductive material. The chucking electrode 152 may be embedded in the electrostatic chuck 150. The chucking electrode 152 is coupled to a chucking power source 154 that, when energized, electrostatically clamps the substrate 190 to the upper surface 192 of the electrostatic chuck 150.

The chucking electrode 152 may be configured as a monopolar or bipolar electrode, or have another suitable arrangement. The chucking electrode 152 may be coupled through an RF filter 156 to the chucking power source 154, which provides direct current (DC) power to electrostatically secure the substrate 190 to the upper surface 192 of the electrostatic chuck 150. The RF filter 156 prevents RF power utilized to form plasma within the process chamber 100 from damaging electrical equipment or presenting an electrical hazard outside the chamber. The electrostatic chuck 150 may be fabricated from a ceramic material, such as AlN or $Al_2O_3$. Alternately, the electrostatic chuck 150 may be fabricated from a polymer, such as polyimide, polyetheretherketone (PEEK), polyaryletherketone (PAEK), and the like.

A power application system 162 is coupled to the substrate support assembly 146. The power application system 162 may include the heater power source 106, the chucking power source 154, a first radio frequency (RF) power source 180, and a second RF power source 182. Implementations of the power application system 162 may additionally include the controller 110, and a sensor device 164 that is in communication with the controller 110 and both of the first RF power source 180 and the second RF power source 182.

The controller 110 may also be utilized to control the plasma from the processing gas by application of RF power from the first RF power source 180 and the second RF power source 182 in order to deposit a layer of material on the substrate 190.

As described above, the electrostatic chuck 150 includes the chucking electrode 152 that may function in one aspect to chuck the substrate 190 while also functioning as a first RF electrode. The electrostatic chuck 150 may also include a second RF electrode 166, and together with the chucking electrode 152, may apply RF power to tune the plasma. The first RF power source 180 may be coupled to the second RF electrode 166 while the second RF power source 182 may be coupled to the chucking electrode 152. A first matching network and a second matching network may be provided for the first RF power source 180 and the second RF power source 182, respectively. The second RF electrode 166 may be a solid metal plate of a conductive material as shown. Alternatively, the second RF electrode 166 may be a mesh of conductive material.

The first RF power source 180 and the second RF power source 182 may produce power at the same frequency or a different frequency. In some implementations, one or both of the first RF power source 180 and the second RF power source 182 may independently produce power at a frequency from about 350 KHz to about 100 MHz (e.g., 350 KHz, 2 MHz, 13.56 MHz, 27 MHz, 40 MHz, 60 MHz, or 100 MHz). In some implementations, the first RF power source 180 may produce power at a frequency of 13.56 MHz and the second RF power source 182 may produce power at a frequency of 2 MHz, or vice versa. RF power from one or both of the first RF power source 180 and second RF power source 182 may be varied in order to tune the plasma. For example, the sensor device 164 may be used to monitor the RF energy from one or both of the first RF power source 180 and the second RF power source 182. Data from the sensor device 164 may be communicated to the controller 110, and the controller 110 may be utilized to vary power applied by the first RF power source 180 and the second RF power source 182.

Other deposition chambers may also benefit from the present disclosure and the parameters listed above may vary according to the particular deposition chamber used to form the amorphous carbon layer. For example, other deposition chambers may have a larger or smaller volume, requiring gas flow rates that are larger or smaller than the gas flow rates recited for deposition chambers available from Applied Materials, Inc.

FIG. 2 is a flow diagram of an example method 200 for forming a silicon nitride gap fill in a feature on a substrate using the process chamber 100 depicted in FIG. 1A, according to certain embodiments described herein. As used in this regard, the term "feature" means any intentional surface irregularity. The shape of the feature can be any suitable shape including, but not limited to, trenches and cylindrical vias. Suitable examples of features include, but are not limited to trenches which have a top, two sidewalls and a bottom and vias which have a generally cylindrical sidewall. Other examples of features include without limitation, lines, contact holes, through-holes or other feature definitions utilized in a semiconductor, solar, or other electronic devices, such as high ratio contact plugs. The features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1.

However, those skilled in the art will understand that the precursors and methods described are not limited to gap fill applications and can be used for other films.

In an embodiment, the method 200 begins at operation 202 by positioning a substrate having a feature, such as the substrate 302 shown in FIG. 3, in an interior processing volume 126 of the process chamber 100 for processing. In an embodiment, the substrate, e.g., substrate 302, is transferred into the process chamber 100 and onto the substrate support assembly 146 by any suitable means, such as by substrate transfer port (not shown). The substrate support assembly 146 can be adjusted to a processing position by an actuator (not shown). In an embodiment, the substrate support assembly 146 can include an electrostatic chuck 150 for securing the substrate 302. The substrate 302 can include one or more materials such as nitride, oxide, silicon, and/or a metal (e.g., tungsten, molybdenum, titanium, etc.). Although FIG. 3A shows substrate 302 having a single feature for illustrative purposes, those skilled in the art will understand that there can be more than one feature.

Figure 3A:
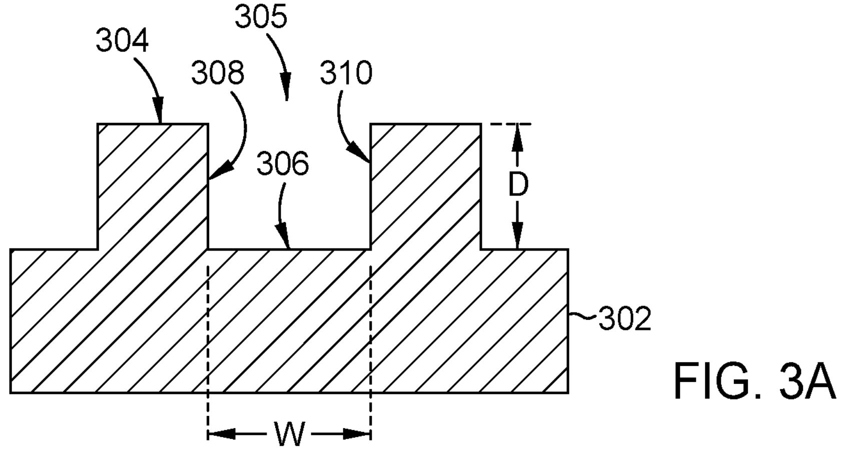
FIGS. 3A through 3I show cross-sectional views of a silicon nitride gap fill feature being formed by the method of FIG. 2, according to certain embodiments of the present disclosure.

In the example shown in FIG. 3A, the substrate 302 has a substrate surface 304 with the at least one feature forming an opening in the substrate surface 304. In an embodiment, the at least one feature includes a trench 305 extending a depth D from the substrate surface 304 to a bottom surface 306. The trench 305 has a first sidewall 308 and a second sidewall 310 that define a width W of the trench 305. The open area formed by the sidewalls 308, 310 and bottom surface 306 are also referred to as a gap.

At operation 204, one cycle of a deposition process is performed on the substrate 302 in the process chamber 100 to deposit a first amorphous silicon layer 312 on the substrate 302. In an embodiment, the process chamber 100 may be a CVD chamber as shown in FIG. 1A, and the first amorphous silicon layer 312 may be deposited on the substrate 302 using a thermal CVD process. The thermal CVD process to deposit the first amorphous silicon layer 312 includes flowing a source-containing precursor gas from the gas panel 130 into the interior processing volume 126 of the chamber 100. In an embodiment, the source-containing precursor gas for forming the first amorphous silicon layer 312 may include silicon-precursor gases such as silane, disaline, tetrasaline, and other higher order silanes, dichlorosilane, trichlorosilane, and silicon tetrachloride. The source-containing precursor gas is provided to the processing volume 126 through, e.g., the gas distribution assembly 120 such that the source-containing precursor gas is uniformly distributed in the processing volume 126. In one embodiment, the plurality of apertures 128 in the gas distribution assembly 120 may be radially distributed and gas flow to each of the plurality of apertures 128 may be separately controlled to further facilitate gas uniformity within the processing volume 126.

The source-containing precursor gas may then be thermally decomposed in the interior processing volume 126 to deposit the first amorphous silicon layer 312 on the substrate surface 304 and in the trench 305. For deposition of the first amorphous silicon layer 312, the temperature of the substrate support assembly 146 in the chamber 100 may be set to between about 100 degrees Celsius and about 1,000 degrees Celsius, e.g., between about 400 degrees Celsius and about 600 degrees Celsius, and the pressure in the chamber may be between about 10 mTorr and about 760 Torr, e.g., about 300 Torr, during the thermal deposition process.

Figure 3B:
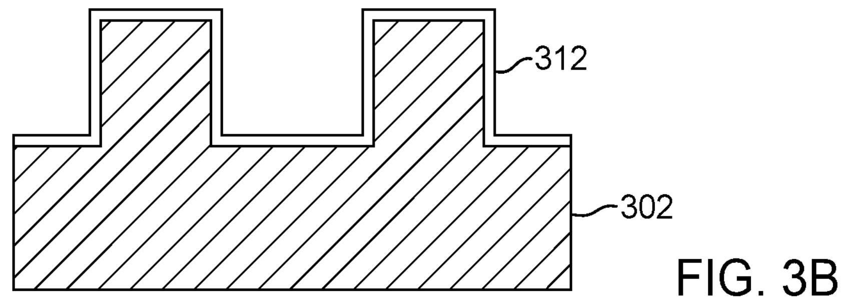

As shown in FIG. 3B, the CVD process may deposit the first amorphous silicon layer 312 over the substrate surface 304 and trench 305, including the bottom surface 306, and first and second sidewalls 308, 310. The as-deposited amorphous silicon layer may have a thickness between about 2 Å and about 5,000 Å.

At operation 206, an amorphous silicon nitridation process is performed on the substrate 302 in the chamber 100 to treat the first amorphous silicon layer 312 and convert the first amorphous silicon layer 312 into a first silicon nitride layer 314. The nitration process can include performing a thermal nitridation process or a plasma-based nitridation process. The silicon nitridation performed using plasma processing can treat a layer of amorphous silicon to form a conformal layer of silicon nitride having a thickness that is from about 5 Å to about 60 Å.

The plasma-based nitridation process includes flowing a process gas, including but not limited to $N_2$, $NH_3$, hydrazine ($N_2H_4$), $H_2$, a noble gas (He, Ar, Ne, Kr, Xe), or combinations thereof, from the gas distribution assembly 120 for generation of a plasma. The plasma can be generated in a plasma region between the substrate and the electrostatic chuck 150 by using the process gas introduced and applying a first RF bias to the electrostatic chuck from one or both of the first RF power source 180 and the second RF power source 182. In general, the RF power may be about 1 kW to about 10 kW, however other power levels are also contemplated.

Figure 3C:
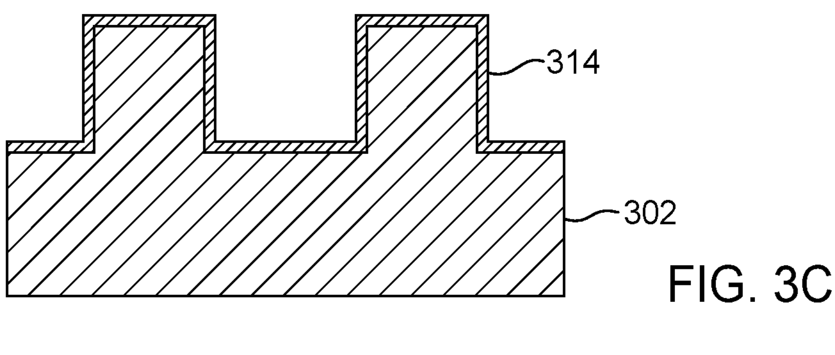

When the plasma is ignited, radical nitrogen containing species formed from the nitrogen-containing process gas react with the substrate 302. Such radical nitrogen containing species can include N and/or NH, for example, N* and/or NH*. During the nitridation process, the radical nitrogen containing species saturate on the surface of the amorphous silicon layer 312 due to high species flux such that diffusion of the reactive species becomes the dominating factor. The diffusion and reaction of the radical nitrogen containing species convert the amorphous silicon atoms in the amorphous silicon layer 312 into SiN, thereby converting the first amorphous silicon layer 312 into the first silicon nitride layer 314, as shown in FIG. 3C.

In operation 206, the process chamber 100 for the nitridation process can be operated at a temperature that is from about 100° C. to about 1200° C., such as from about 150° C. to about 650° C.; and/or a pressure that is from about 0.025 Torr (25 millitorr (mTorr)) to about 5 Torr, such as from about 0.050 Torr (50 mTorr) to about 2 Torr. However, other temperatures and pressures are contemplated. The RF power may be controlled at between about 25 Watts and about 2000 Watts, such as between about 100 Watts and about 800 Watts, for example, about 400 Watts. The plasma forming gas, such as $N_2$ gas, may be supplied at between about 1000 sccm and about 5000 sccm, such as about 2000 sccm. In another embodiment, an $NH_3$ plasma forming gas may be supplied at between about 500 sccm and about 2000 sccm, such as about 1000 sccm.

At operation 208, silicon nucleation on portions of substrate surface 304 and sidewalls 308, 310 near the opening of the trench 305 is selectively inhibited, while nucleation inside the trench 305 on the bottom surface 306 and portions of the sidewalls 308,310 near the bottom surface 306 is not. In an embodiment, selective inhibition of portions of features on the substrate 304 can involve exposure of the features to activated species that passivate the feature surfaces. In the present disclosure, portions of the first silicon nitride layer 314 are passivated by exposure to an oxygen-based plasma where oxygen atoms from the plasma replace the nitrogen atoms in the silicon nitride film, thereby oxidizing the silicon nitride (SiN) and forming a silicon oxide (SiO).

Figure 3D:
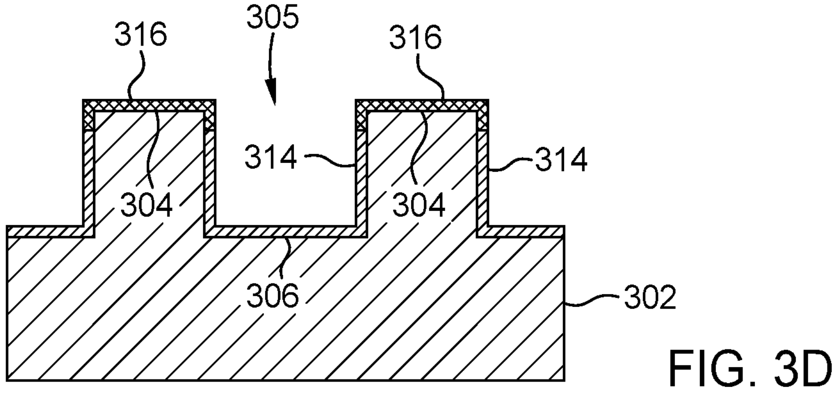
Figure 4:
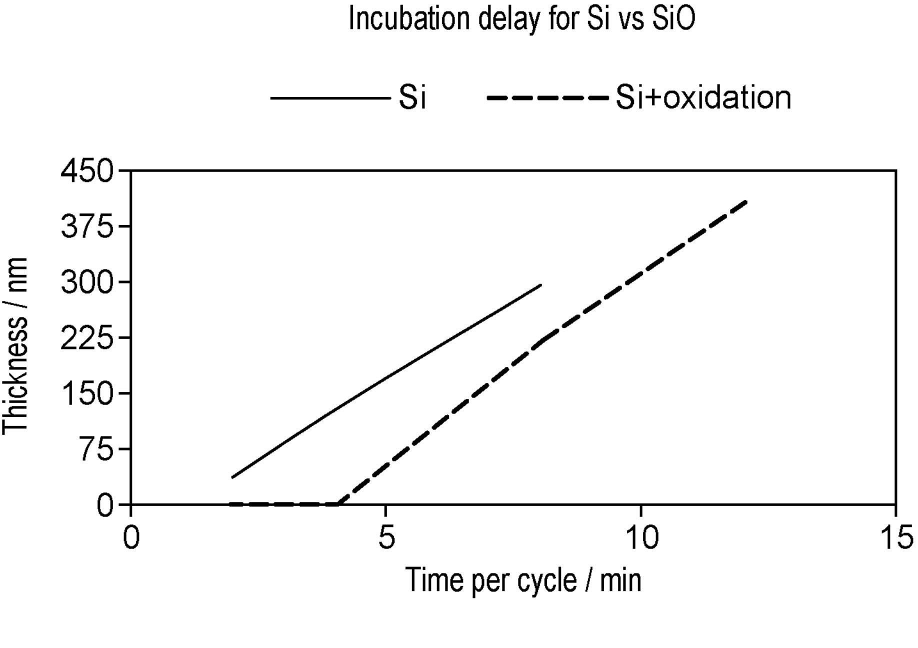
FIG. 4 is a graph showing the incubation delay of amorphous silicon deposition on oxidized silicon surfaces.

In operation 208, selective inhibition is performed by selective oxidation of the above-mentioned portions of the substrate surface 304 and trench 305. As shown in FIG. 3D, portions of the first silicon nitride layer 314 along the substrate surface 304 adjacent to the opening of the trench 305 and portions of the sidewalls 308, 310 near the opening of the trench 305 are selectively oxidized and converted from SiN to SiO to form a silicon oxide layer 316. Oxidation of SiN in the first silicon nitride layer 314 selectively inhibits silicon nucleation for purposes of the present disclosure due to an incubation delay of amorphous silicon deposition observed on oxidized silicon surfaces during thermal CVD processes. FIG. 4 shows the delayed deposition of amorphous silicon on oxidized silicon surfaces as compared to non-oxidized silicon surfaces, such as a SiN layer surface. Such incubation delay on oxidized silicon surfaces may then be utilized in subsequent steps to selectively deposit amorphous silicon on non-inhibited portions of the trench 305.

Exemplary plasma forming gases that may be flowed into the processing volume 126 of the chamber 100 for the oxidation plasma treatment process of operation 208 include oxygen-containing gases such as oxygen ($O_2$), dinitrogen monoxide ($N_2O$), and the like. In certain embodiment, tuning the inhibited profile on the substrate 302 (e.g. selective oxidation on portions of substrate surface 304 and sidewalls 308, 310 near the opening of the trench 305) can involve appropriately tailoring and selecting one or more substrate bias power, plasma power, process pressure, gas type, exposure time, and other process parameters, such as spacing between the substrate support assembly 146 and the gas distribution assembly 120. When properly tuned, the oxygen radicals from the ignited plasma may contact and react with only portions of the SiN layer deposited on the substrate surface 304 and sidewalls 308, 310 near the opening of the trench 305, thereby selectively oxidizing and converting only such portions of the first silicon nitride layer 314 to silicon oxide.

In one embodiment, the process pressure is controlled at between about 0.1 Torr and about 100 Torr (e.g., between about 0.1 Torr and about 80 Torr; between about 1 Torr and about 20 Torr or between about 7 Torr and about 30 Torr). In one implementation, the processing temperature is between about 100 degrees Celsius and about 900 degrees Celsius (e.g., between about 125 degrees Celsius and about 350 degrees Celsius, for example between about 200 degrees Celsius and about 300 degrees Celsius, such as between about 164 degrees Celsius and about 340 degrees Celsius). The RF power may be controlled at between about 25 Watts and about 2000 Watts, such as between about 100 Watts and about 800 Watts, for example, about 400 Watts. The plasma forming gas, such as $O_2$ gas, may be supplied at between about 5 sccm and 200 sccm.

Figure 3E:
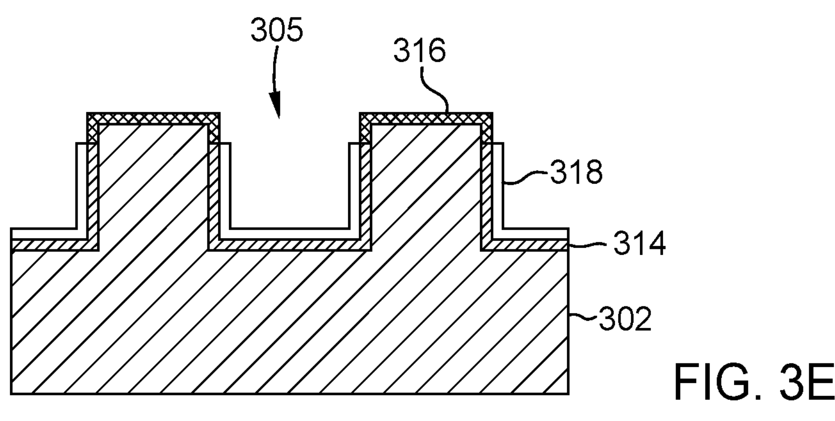

Once portions of the first silicon nitride layer 314 along the substrate surface 304 adjacent to the opening of the trench 305 and portions of the sidewalls 308, 310 near the opening of the trench 305 are selectively inhibited by selective oxidation, a thermal CVD process is next performed in operation 210 to selectively deposit a second amorphous silicon layer 318 according to the inhibited profile on the remaining uninhibited/non-oxidized portions of the first silicon nitride layer 314. Selective deposition according to the inhibited profile is selective in that the thermal CVD process in operation 410 is only performed for (or less then) the duration in which the amorphous silicon initially and preferentially only grows on non-oxidized silicon surfaces. In an embodiment, the thermal CVD process is therefore performed between about 1 to 4 minutes, such between about 2 to 3 minutes. As shown in FIG. 3E, the selective deposition of amorphous silicon forms the second amorphous silicon layer 318 on only the non-inhibited portions of the first silicon nitride layer 314 in trench 305.

Figure 3F:
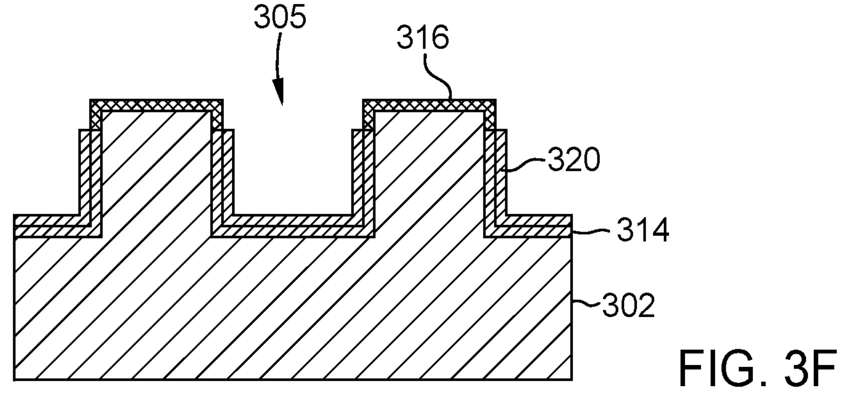

In operation a 212, an amorphous silicon nitridation process similar to the nitridation process performed in operation 206 is performed in the process chamber 100 to treat the second amorphous silicon layer 318 and convert the second amorphous silicon layer 318 into a second silicon nitride layer 320 formed in the trench 305, as shown in FIG. 3F.

Figure 3G:
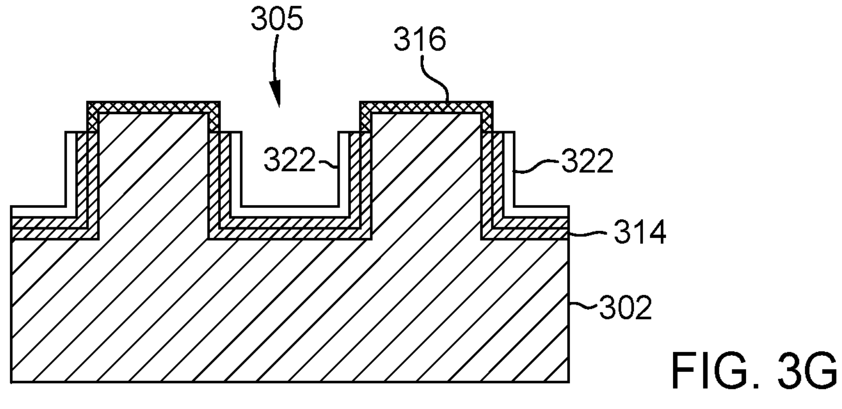
Figure 3H:
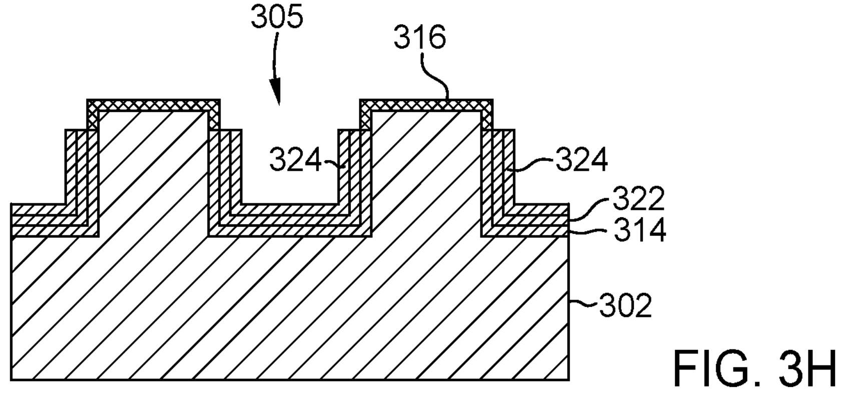
Figure 3I:
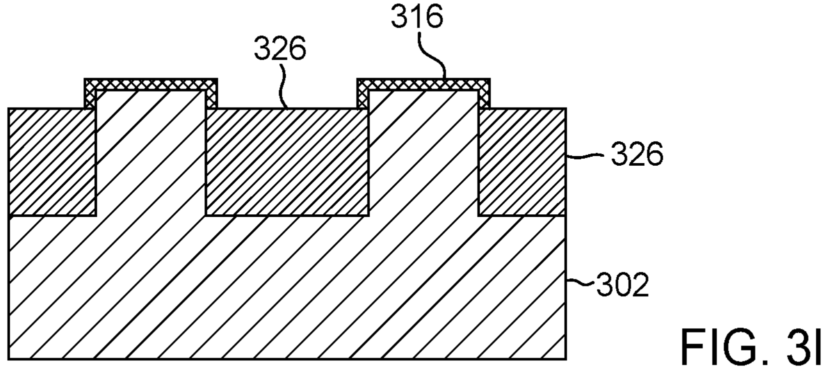

The selective oxidizing, selective depositing, and nitriding processes in operations 208, 210, and 212 can be sequentially repeated to fill the trench 305. In certain embodiments, the number of cycles may depend on the size and depth of the feature being filled. After the second silicon nitride layer 320 is formed in the trench 305, the selective plasma oxidation process is also repeated to reinforce the silicon nucleation inhibition of the silicon oxide layer 316. FIG. 3G shows a third amorphous silicon layer 322 selectively deposited on the second silicon nitride layer 320 and subsequently converted to a third silicon nitride layer 324, as shown in FIG. 3H. FIG. 3I show a silicon nitride gap fill 326 formed in trench 305 after a sufficient number of cycles of operations 208, 210, and 212 is repeated to completely fill the trench 305 with silicon nitride layers.

Figure 5:
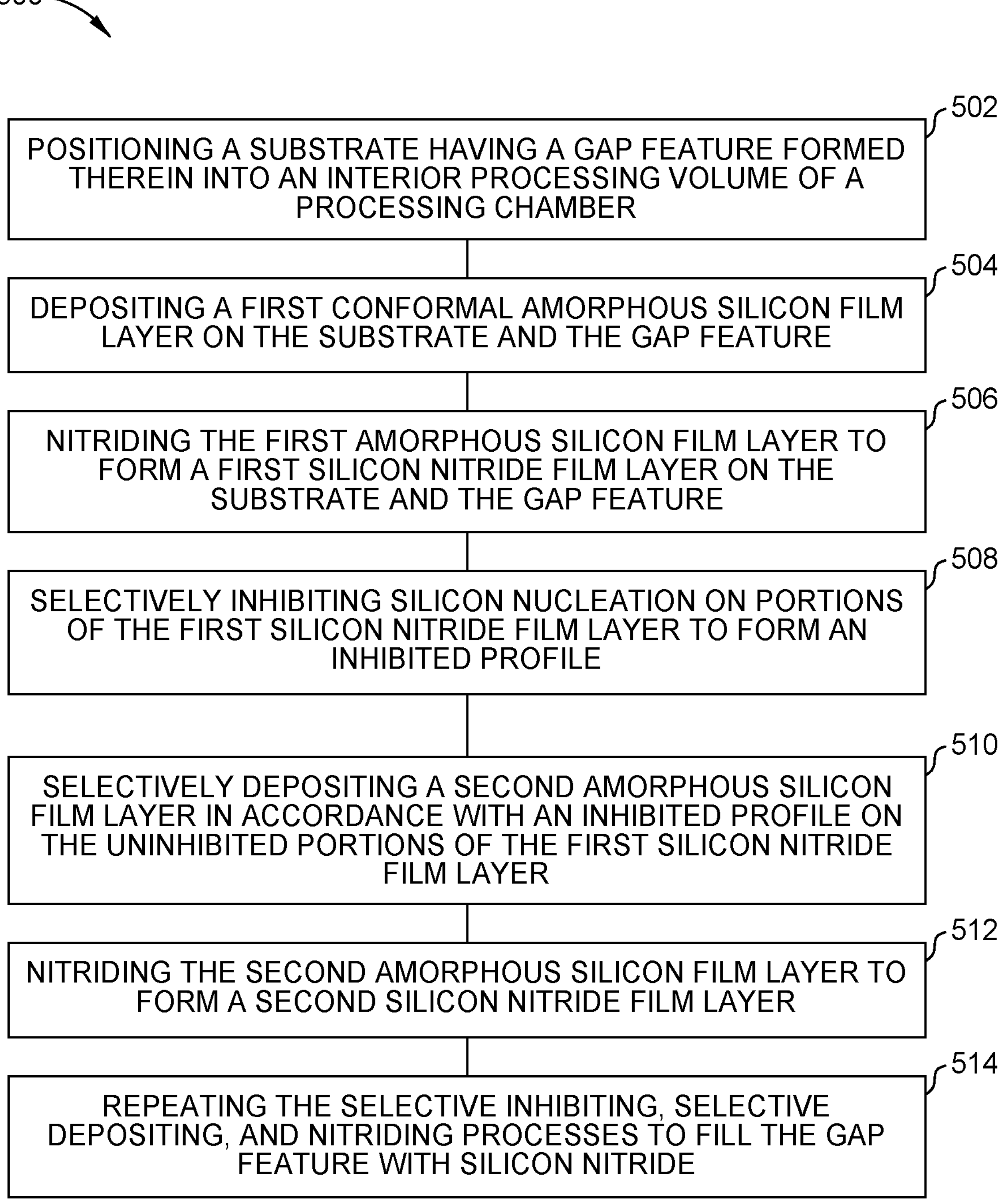
FIG. 5 is a flow diagram of an embodiment of a method for forming a silicon nitride gap fill in a gap feature, according to certain embodiments of the present disclosure.

FIG. 5 is a flow diagram of an embodiment of a method 500 for forming a silicon nitride gap fill in a gap feature, according to one embodiment of the present disclosure.

Method 500 begins at operation 502 by positioning a substrate having a gap feature in an interior processing volume 126 of the process chamber 100 for processing. In an embodiment, the substrate is transferred into the process chamber 100 and onto the substrate support assembly 146 by any suitable means, such as by a substrate transfer port (not shown).

In operation 504, a deposition process is performed in the process chamber 100 to deposit a first conformal amorphous silicon layer on the substrate and the gap feature.

In operation 506, a nitridation process is performed to convert the first conformal amorphous silicon layer into a first silicon nitride layer. After the nitridation process, a first silicon nitride layer is disposed directly on the substrate and the gap feature.

In operation 508, a selective inhibition process is performed in accordance with an inhibited profile to selective inhibit silicon nucleation on the first silicon nitride layer disposed on portions of the substrate and gap feature. In an embodiment, the inhibited profile of the substrate and gap feature includes the substrate surface over the field of the opening of the gap feature as well as the top portions of the sidewalls in the gap feature near the opening. Selective inhibition, which may also be referred to as preferential inhibition, preferential passivation, selective passivation, differential inhibition, or differential passivation, involves inhibiting subsequent silicon nucleation on a portion of the substrate and gap feature, while not inhibiting nucleation (or inhibiting nucleation to a lesser extent) on the remainder of the substrate and gap feature.

Selective inhibition can involve selectively exposing a portion of the substrate and gap feature in accordance with the inhibited profile to activated species of a plasma. In one embodiment, the substrate and gap feature is selectively inhibited by being selectively exposed to a plasma generated from molecular oxygen containing gas in the process chamber. The desired inhibited profile can be formed by appropriately selecting one or more of inhibition chemistry, substrate bias power, plasma power, process pressure, exposure time, and other process parameters, such spacing between the substrate and the showerhead of the process chamber.

Once the selective inhibition process is performed, the method 400 can continue at operation 510 with selective deposition of a second amorphous silicon layer according to the inhibited profile. Operation 508 may involve one or more CVD and/or atomic layer deposition (ALD) processes, including thermal and plasma-enhanced CVD and/or ALD processes. The deposition is selective in that during the deposition process, the amorphous silicon preferentially grows on the lesser- and non-inhibited portions of the substrate surface and gap feature. The deposition process may be performed for a limited time during which the inhibition of the silicon nucleation is in effect. In an embodiment, operation 510 involves selectively depositing amorphous silicon in a bottom or interior portion of the gap feature.

In operation 512, an amorphous silicon nitridation process similar to the nitridation process performed in operation 406 is performed in the process chamber 100 to treat the second amorphous silicon layer and convert the second amorphous silicon layer into a second silicon nitride layer. In an embodiment, the second silicon nitride layer formed in operation 512 is disposed over the first silicon nitride layer in the gap feature.

The selective inhibiting, selective depositing, and nitriding processes in operations 508, 510, and 512 can be sequentially repeated until the gap feature is completely filled with silicon nitride.

Using aspects described herein, in certain embodiments, it has been found that by using the cyclic amorphous silicon deposition, nitridation, and selective oxidation processes disclosed herein, a feature on a substrate, such as a trench, can be filled seamlessly from bottom-up with layers of SiN to form a SiN gap fill. In an embodiment, the cyclic deposition, nitridation, and oxidation processes disclosed herein may be performed in situ in the same process chamber 100 making transfers of the substrate and use of costly cluster systems unnecessary. Furthermore, because the deposition process utilized herein only requires the deposition of amorphous silicon, the present disclosure enables the formation of complete seamless SiN gap fill with low cost silicon-precursor gases such as silane and disilane, as compared to other deposition methods that may require high-cost customized precursors.

While the foregoing is directed to embodiments of the present disclosure, other and further embodiments of the disclosure may be devised without departing from the basic scope thereof, and the scope thereof is determined by the claims that follow.

What is claimed is:

1. A method for forming a silicon nitride structure, comprising:
- positioning a substrate having at least one feature thereon in a process chamber;
- depositing a first silicon layer on the substrate and the at least one feature;
- nitriding the first silicon layer to form a first silicon nitride layer on the substrate and the at least one feature;
- selectively inhibiting silicon nucleation on a portion of the first silicon nitride layer to form an inhibited profile;
- selectively depositing a second silicon layer on the first silicon nitride layer in accordance with the inhibited profile; and
- nitriding the second silicon layer to form a second silicon nitride layer disposed directly on the first silicon nitride layer.

2. The method of claim 1, wherein the at least one feature extends a depth from a substrate surface to a bottom surface, and has a width defined by a first sidewall and a second sidewall, and further comprising:
- repeating selectively inhibiting, selectively depositing, and nitriding processes sequentially to fill the at least one feature with silicon nitride and form a silicon nitride gap fill.

3. The method of claim 2, wherein the at least one feature has substantially no seams in the silicon nitride gap fill.

4. The method of claim 1, wherein depositing the first silicon layer and selectively depositing the second silicon layer comprises performing a thermal CVD process or a thermal ALD process.

5. The method of claim 1, wherein selectively inhibiting silicon nucleation on a portion of the first silicon nitride layer comprises selectively oxidizing the portion of the first silicon nitride layer into a silicon oxide layer.

6. The method of claim 4, wherein depositing the first silicon layer and selectively depositing the second silicon layer comprises flowing a source-containing precursor gas into an interior processing volume of a process chamber, wherein the source-containing precursor gas is selected from the group consisting of: silane, disilane, tetrasaline, and other higher order silanes, dichlorosilane, trichlorosilane, and silicon tetrachloride and thermally decomposing the precursor gas in the interior processing volume.

7. The method of claim 1, wherein nitriding the first silicon layer and the second silicon layer comprises performing a plasma nitridation process in the process chamber.

8. The method of claim 1, wherein selectively depositing a second silicon layer comprises performing a thermal CVD process in the process chamber for a duration less than an SiO incubation delay time period, wherein the SiO incubation delay time period comprises a period of time it takes for amorphous silicon to first be deposited on an oxidized silicon surface in a thermal CVD process.

9. The method of claim 1, wherein selectively depositing a second silicon layer comprises performing a thermal ALD process in the process chamber for a duration less than an SiO incubation delay time period, wherein the SiO incubation delay time period comprises a period of time it takes for amorphous silicon to first be deposited on an oxidized silicon surface in a thermal ALD process.

10. The method of claim 1, wherein the inhibited profile comprises silicon nucleation being inhibited on one or more portions of the first silicon nitride layer disposed on a substrate surface and on a top portion of a first sidewall and a second sidewall near an opening of the at least one feature in the substrate surface.

11. The method of claim 1, wherein the first silicon layer comprises an amorphous silicon layer.

12. A method for forming a silicon nitride gap fill, comprising:

positioning a substrate having at least one feature thereon in a process chamber, the at least one feature extending a depth from a substrate surface to a bottom surface, and having a width defined by a first sidewall and a second sidewall;

depositing a first amorphous silicon layer on the substrate and the at least one feature;

nitriding the first amorphous silicon layer to form a first silicon nitride layer on the substrate and the at least one feature;

selectively oxidizing one or more portions of the first silicon nitride layer disposed on the substrate surface and on a top portion of the first and second sidewalls near an opening of the at least one feature in the substrate surface to form a silicon oxide layer on one or more portions of the substrate and inhibit silicon nucleation on the one or more oxidized portions of the first silicon nitride layer;

selectively depositing a second silicon layer on the remaining non-oxidized portions of first silicon nitride layer on the substrate; and nitriding the second silicon layer to form a second silicon nitride layer disposed directly on the remaining non-oxidized portions of the first silicon nitride layer.

13. The method of claim 12, further comprising repeating selectively oxidizing, selectively depositing, and nitriding processes sequentially to fill the at least one feature with silicon nitride and form a silicon nitride gap fill, wherein the at least one feature has substantially no seams in the silicon nitride gap fill.

14. The method of claim 12, wherein depositing the first amorphous silicon layer and selectively depositing the second silicon layer comprises performing a thermal CVD process or a thermal ALD process.

15. The method of claim 12, wherein depositing the first amorphous silicon layer and selectively depositing the second silicon layer comprises flowing a source-containing precursor gas into an interior processing volume of a process chamber, wherein the source-containing precursor gas is selected from the group consisting of: silane and disilane, and thermally decomposing the precursor gas in the interior processing volume.

16. The method of claim 12, wherein nitriding the first silicon layer and the second silicon layer comprises performing a plasma nitridation process in the process chamber.

17. The method of claim 12, wherein selectively depositing a second silicon layer comprises performing a CVD process or an ALD process for a duration less than an SiO incubation delay time period, wherein the SiO incubation delay time period comprises a period of time it takes for amorphous silicon to first be deposited on an oxidized silicon surface in a CVD process or an ALD process, respectively.

18. A method for forming a silicon nitride gap fill, comprising:

positioning a substrate having at least one feature thereon in a process chamber, the at least one feature extending a depth from a substrate surface to a bottom surface, and having a width defined by a first sidewall and a second sidewall;

performing a deposition process to deposit a first amorphous silicon layer on the substrate and the at least one feature;

performing a plasma nitridation process on the substrate to convert the first amorphous silicon layer to a first silicon nitride layer;

performing a plasma oxidation process to selectively oxidize one or more portions of the first silicon nitride layer on one or more portions of the substrate and at least one feature;

performing a deposition process to selectively deposit a second amorphous silicon layer on the remaining non-oxidized portions of first silicon nitride layer on the substrate;

performing the plasma nitridation process on the substrate to convert the second amorphous silicon layer into a second silicon nitride layer disposed directly on the remaining non-oxidized portions of the first silicon nitride layer; and repeating the selective plasma oxidation, selective deposition, and plasma nitridation processes sequentially to fill the at least one feature with silicon nitride and form the silicon nitride gap fill.

19. The method in claim 18, wherein the at least one feature has substantially no seams in the silicon nitride gap fill.

20. The method in claim 18, wherein performing the deposition process to selectively deposit the second amorphous silicon layer comprises performing a CVD process or an ALD process for a duration less than an SiO incubation delay time period, wherein the SiO incubation delay time period comprises a period of time it takes for amorphous silicon to first be deposited on an oxidized silicon surface in a CVD process or an ALD process, respectively.

* * * * *